US008476526B2

(12) United States Patent
Lichy

(10) Patent No.: US 8,476,526 B2
(45) Date of Patent: Jul. 2, 2013

(54) DEVICE FOR ELECTRIC FIELD CONTROL

(75) Inventor: Radim Lichy, Alingsås (SE)

(73) Assignee: ABB Technology Ltd., Zürich (CH)

( * ) Notice: Subject to any disclaimer, the term of this patent is extended or adjusted under 35 U.S.C. 154(b) by 902 days.

(21) Appl. No.: 12/305,956

(22) PCT Filed: Jun. 12, 2007

(86) PCT No.: PCT/EP2007/055770
§ 371 (c)(1),
(2), (4) Date: Dec. 20, 2008

(87) PCT Pub. No.: WO2007/147755
PCT Pub. Date: Dec. 27, 2007

(65) Prior Publication Data
US 2010/0288527 A1 Nov. 18, 2010

(30) Foreign Application Priority Data

Jun. 21, 2006 (EP) ..................... 06115839

(51) Int. Cl.
*H02G 15/00* (2006.01)
(52) U.S. Cl.
USPC ................. 174/73.1; 29/605; 29/606; 29/618
(58) Field of Classification Search
USPC ................. 174/73.1, 650, 77 R, 152 R, 76.1, 174/137 R, 142, 153 G, 152 G, 75 R, 88 R, 174/260; 29/868, 606, 618, 605
See application file for complete search history.

(56) References Cited

U.S. PATENT DOCUMENTS

| 1,585,124 | A | * | 5/1926 | Simons | 174/21 R |
| 1,987,918 | A | * | 1/1935 | Waring et al. | 174/74 R |
| 2,645,701 | A | * | 7/1953 | Enoch et al. | 338/302 |
| 2,790,842 | A | * | 4/1957 | Nicholas | 174/20 |
| 3,051,770 | A | * | 8/1962 | Palmieri | 174/22 R |
| 3,254,150 | A | * | 5/1966 | Rogers, Jr. | 174/17 R |
| 3,297,970 | A | * | 1/1967 | Jones | 336/205 |
| 3,944,720 | A | * | 3/1976 | Tailler | 174/73.1 |
| 4,034,151 | A | * | 7/1977 | Silva et al. | 174/73.1 |
| 4,099,021 | A | * | 7/1978 | Venezia | 174/73.1 |

(Continued)

FOREIGN PATENT DOCUMENTS

| EP | 0 683-557 | 11/1995 |
| JP | 40-26496 | 11/1940 |

(Continued)

OTHER PUBLICATIONS

International Search Report—Aug. 23, 2007.

(Continued)

*Primary Examiner* — Bradley Thomas
*Assistant Examiner* — Theron Milliser
(74) *Attorney, Agent, or Firm* — Venable LLP; Eric J. Franklin

(57) ABSTRACT

A device for controlling an electric field at a high voltage component including a resistive layer for field control, an insulating layer arranged on the resistive layer and a semi-conducting or conducting layer arranged on the insulating layer. The three layers meet at a triple point where the insulating layer ends. An interface between the resistive layer and the insulating layer makes in the triple point an angle to the semi-conducting or conducting layer of 60°-120°.

8 Claims, 4 Drawing Sheets

U.S. PATENT DOCUMENTS

| | | | | |
|---|---|---|---|---|
| 4,192,964 A | * | 3/1980 | Sacks | 174/73.1 |
| 4,383,131 A | * | 5/1983 | Clabburn | 174/73.1 |
| 4,822,952 A | * | 4/1989 | Katz et al. | 174/73.1 |
| 5,985,062 A | | 11/1999 | Vallauri et al. | |
| 2004/0099434 A1 | | 5/2004 | Balconi et al. | |
| 2004/0209025 A1 | * | 10/2004 | Kobayashi et al. | 428/34.9 |

FOREIGN PATENT DOCUMENTS

| | | |
|---|---|---|
| JP | 61-54813 | 3/1986 |
| JP | 61-185229 | 11/1986 |
| JP | 8-47156 | 2/1996 |
| JP | 10-201073 | 7/1998 |
| JP | 11-041779 | 2/1999 |
| JP | 11-069593 | 9/1999 |
| JP | 2003-125528 | 4/2003 |
| JP | 2004-274913 | 9/2004 |
| WO | WO 00/74191 | 12/2000 |

OTHER PUBLICATIONS

International Preliminary Report on Patentability—Jun. 18, 2008.
Notice of reasons for rejection, issued by the Japanese Patent Office in connection with counterpart Japanese Patent Application No. 2009-515827, Jan. 10, 2012.
First Office Action mailed on Nov. 20, 2012, from the Japanese Patent Office, issued in connection with counterpart Japanese Patent Application No. 2009-515827.

* cited by examiner

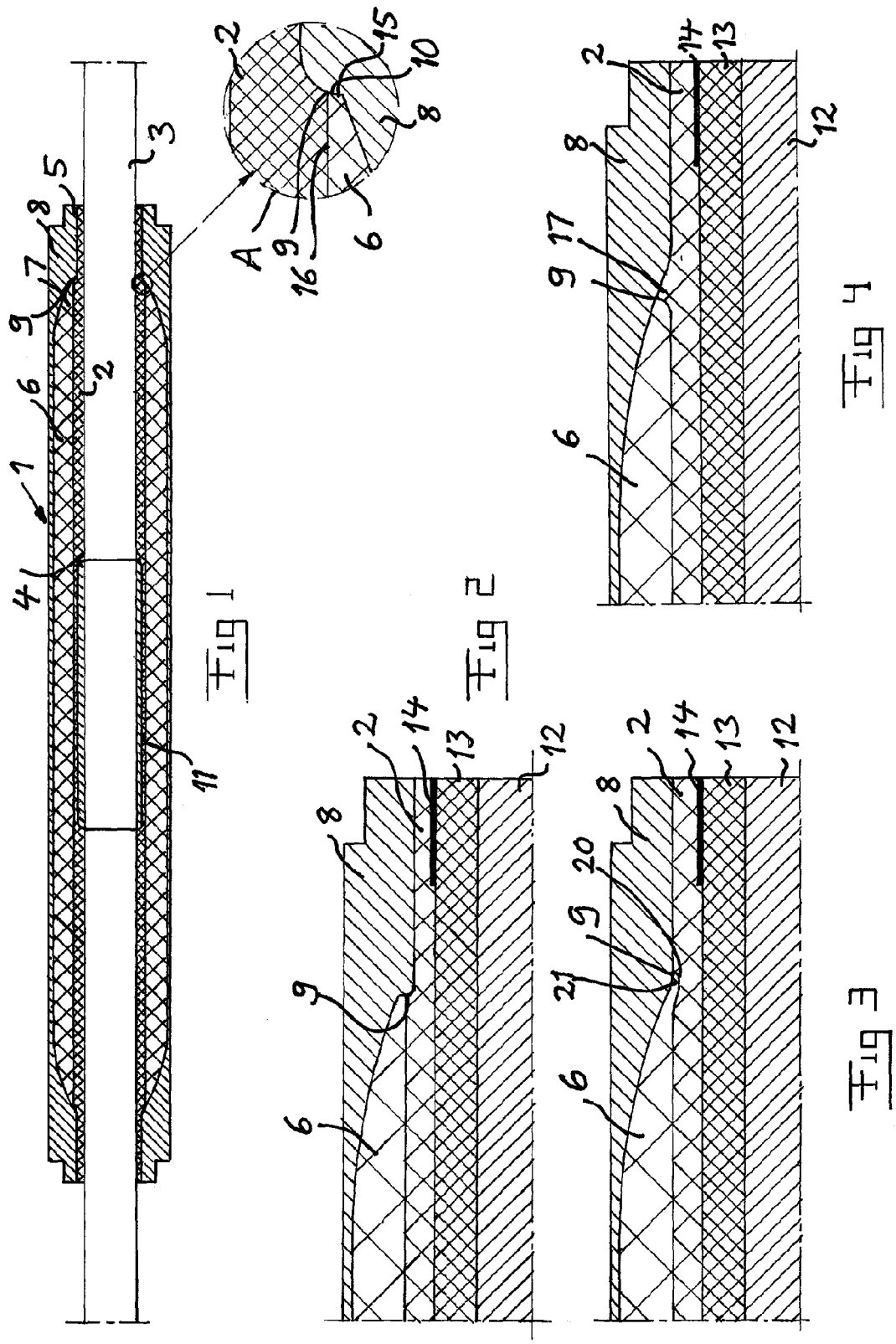

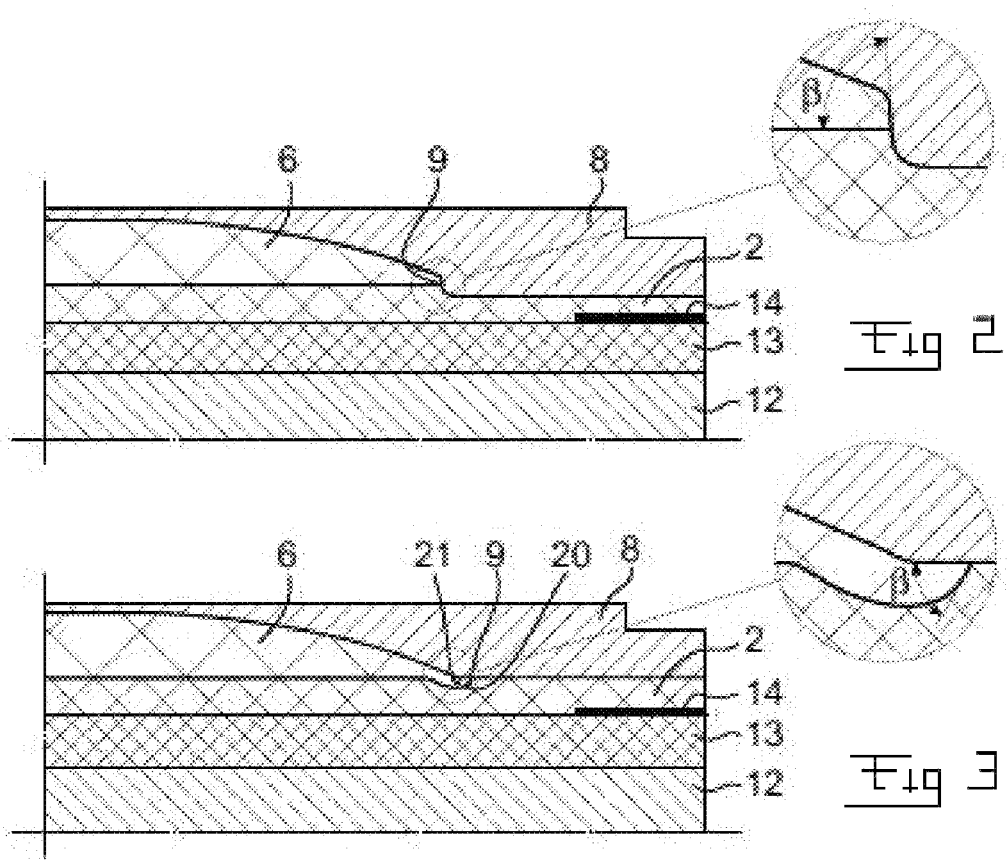

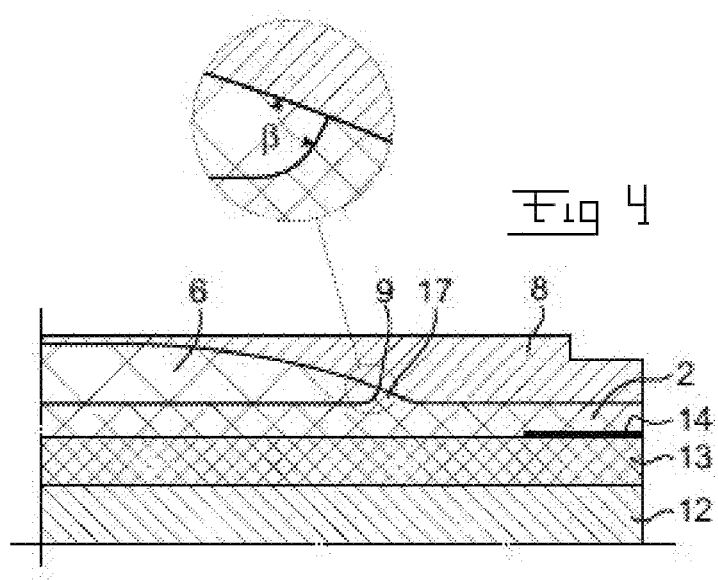

DEVICE FOR ELECTRIC FIELD CONTROL

CROSS-REFERENCE TO RELATED APPLICATIONS

This application claims priority to European patent application 06115839.0 filed 21 Jun. 2006 and is the national phase under 35 U.S.C. §371 of PCT/EP2007/055770 filed 12 Jun. 2007.

TECHNICAL FIELD OF THE INVENTION AND PRIOR ART

The present invention relates to a device for controlling an electric field at a high voltage component, said device comprising a resistive layer adapted, for field controlling purposes, to be arranged along a said component and which at one end is adapted to be electrically connected to a live high voltage part of the component and, at its other end, adapted to be electrically connected to ground potential, an insulating layer arranged on said resistive layer and extending outside thereof from said one end towards said other end while ending by a tapering field controlling geometry without reaching at a distance to said other end, as well as a semi-conducting or conducting layer arranged on the insulating layer and extending outside thereof past the end of the insulating layer towards said other end of the resistive layer, so that said resistive layer, said insulating layer and said semi-conducting or conducting layer meet at a triple point at said end of the insulating layer.

The high voltage component may carry an alternating voltage or a direct voltage, and it may for instance be a high voltage cable, in which the device may be used in a cable joint or a cable termination. Other high voltage components are also conceivable, such as bushings in switchgears and vacuum breakers.

A device of this type is known through for instance WO 00/74191 A1. A device of this type is used for distributing the electric field where this is crucial and by that avoiding electric field concentrations and damaging of different type of equipments, such as cables. The electric potential between the live part and ground is distributed by means of a material with a suitable resistance forming said resistive layer. By combining the resistive field control and a geometrical field control obtained through said insulating layer the risk of harmful charges building up and of high stresses upon said component, such as a cable, arising at rapid changes of the voltage thereof, is reduced with respect to such a device having only a resistive field control through a said resistive layer.

However, when using known electric field control devices of the type defined in the introduction for voltages above a determined limit, which is depending on the material used for the different layers, the device will be damaged limiting the use of such a device with respect to the level of said high voltage. It has turned out that the device will be damaged in the region of said triple point, where the insulating layer, the semi-conducting or con-ducting layer and the resistive layer meet.

SUMMARY OF THE INVENTION

It is an object of the present invention to provide an electric field control device of the type defined in the introduction which may be used for higher voltages than such electric field control devices already known without being damaged.

This object is according to the invention obtained by providing such a device in which said resistive layer and said insulating layer are close to said end of the insulating layer designed so that the interface between these two layers ends in said triple point by making an angle to said semi-conducting or conducting layer of 60°-120°.

It has been found that said angle of said interface strongly influences the behaviour of the materials in said triple point, and that considerably higher voltages may be taken by these materials without damaging the device in this region by selecting said angle within said interval thanks to the advantageous extension of the equipotential lines in the resistive layer and the insulating layer close to said triple point. This also means that for a given voltage level less material may be used for said resistive layer while still being able to take the voltage, which results in a considerable reduction of costs, since this field controlling material is expensive. This angle is preferably obtained by the new approach to work and shape the resistive field controlling layer at said triple point.

According to an embodiment of the invention the resistive layer and said insulating layer are close to said end of the insulating layer designed so that said interface therebetween ends in said triple point by making a said angle to said semi-conducting or conducting layer of 70°-110°, advantageously 80°-100°, and preferably 85°-95°. It has been found that it is in most cases with respect to the stresses on said triple point most favourable to have said angle close to 90°, but angles within said intervals may be chosen for ease of manufacturing or other reasons while still giving the desired result with respect to preventing damage in the region of the triple point.

According to another embodiment of the invention said insulating layer ends in the extension thereof from said one end towards said other end by a substantially sharp edge forming a transversal surface continuing into the resistive layer for forming a step in said resistive layer and making this thinner in the direction towards said other end for obtaining said angle in said triple point. A device of this type is easy to manufacture and results in comparatively small waste of the expensive field controlling material of said resistive layer.

According to another embodiment of the invention said resistive layer has a recess in the region of said triple point receiving an end portion of said insulating layer for obtaining said angle in said triple point.

According to another embodiment of the invention said resistive layer has a tip-like elevation in the region of said triple point with the tip ending in said triple point and having said insulating layer on one side thereof and said semi-conducting or conducting layer on the other side thereof for obtaining said angle in said triple point. Such a tip-like elevation may be manufactured while very reliably defining said angle to the value desired, but the manufacturing thereof will result in a greater waste of said field controlling material than for the two previous embodiments.

According to another embodiment of the invention said superimposed resistive layer, insulating layer and semi-conducting or conducting layer form a sleeve for receiving said high voltage component with the resistive layer being the innermost layer of the sleeve.

According to another embodiment of the invention the device is adapted to control electric fields at high voltage components having an alternating voltage or a direct voltage on said live high voltage part, and it is adapted to control electric fields for high voltages being above 1 kV, above 50 kV, above 100 kV, 130 kV-400 kV, 200 kV-400 kV or 250 kV-350 kV. The invention is the more interesting the higher the voltage is, although it may also be favourable for voltages being low in this context, which means for instance in the order of 10 kV. The invention is especially applicable to voltages in the region of 100 kV-400 kV, for which damage of the region of said triple point constitutes an obstacle to raising the voltage further in for instance high voltage cable joints or cable terminations.

The invention also relates to a cable joint for joining two high voltage DC-cables or AC-cables provided with a device for electric field control according to the invention, as well as a cable termination for terminating a high voltage DC-cable or AC-cable provided with a device for electric field control according to the invention. These are two preferred uses of a device for controlling an electric field of this type, since they are often sensitive parts of a large power transmission system, in which there is an ongoing attempt to raise the voltages for reducing power losses.

The invention also relates to a method for manufacturing a device for controlling an electric field comprising the following steps: the resistive layer is wound around a carrier in a number of sub-layers and then ground to the desired shape, the insulating layer is then wound outside the resistive layer in a number of sub-layers and then ground to the desired shape, and the semi-conducting or conducting layer is wound in sub-layers outside the insulating layer and the resistive layer, and the resistive layer and/or the insulating layer are in the previous steps ground for obtaining said angle in said triple point.

Further advantages as well as advantageous features of the invention will appear from the following description.

BRIEF DESCRIPTION OF THE DRAWINGS

With reference to the appended drawings, below follow a specific description of embodiments of the invention cited as examples.

In the drawings:

FIG. 1 is a cross-section view of a cable joint provided with an electric field control device according to an embodiment of the present invention, FIGS. 2-4 are enlarged simplified cross-section views of a part of electric field control devices according to different embodiments of the invention in the region of said triple point.

DETAILED DESCRIPTION OF EMBODIMENTS OF THE INVENTION

Figure 5:
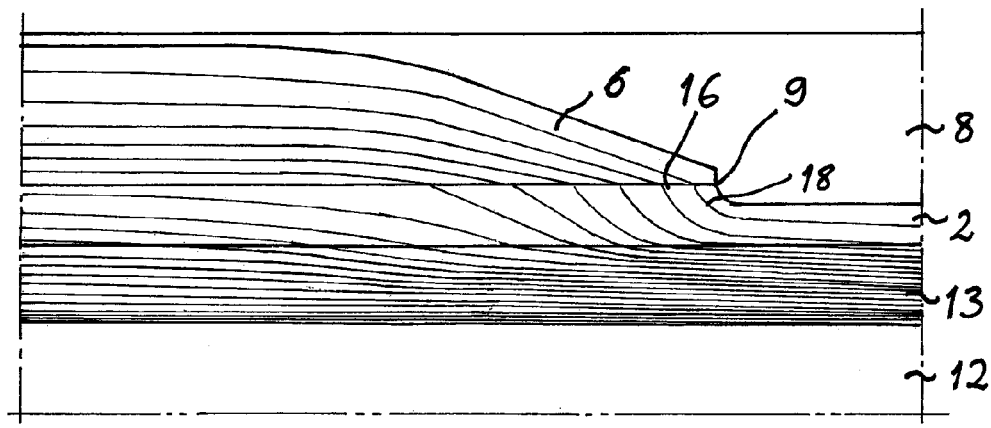
FIGS. 5 and 6 are views of the embodiments according to FIGS. 2 and 4 illustrating the extension of the equipotential lines in the case of a high voltage on a cable connected to the cable joint.

A cable joint 1 is shown in cross-section in FIG. 1. This cable joint has an inner resistive layer 2 with electric field controlling properties adapted to be arranged along a cable 3 and to be at one end 4 connected to a live high voltage part of the cable and at it's other end 5 electrically connected to ground potential by being connected to the outer semi-conducting sheath of the cable.

An insulating layer 6 is arranged outside the resistive layer and extend towards said other end 5 while ending by a tapering field controlling geometry 7 without reaching and at a distance to this end 5.

A semi-conducting or conducting layer 8 is arranged outside the insulating layer and extend past the end of the insulating layer towards said other end 5 of the resistive layer, so that the resistive layer, the insulating layer and the semi-conducting or the conducting layer meet at a triple point 9 at said end 10 of the insulating layer. The material of the different layers 2, 6 and 8 may for example be EPDM-rubber or silicone rubber with different additives giving the different layers the properties desired.

A deflector 11 having nothing to do with the present invention is arranged in the region of the end of a live part of the respective cable for protection against discharges and the like.

The appearance of the resistive layer 2, the insulating layer 6 and the semi-conducting or conducting layer 8 in the region of said triple point 9 is shown by an enlargement A. This corresponds to the embodiment shown in FIG. 2, which will now be described. The live part or conductor 12 and the insulating layer or sheath 13 as well as the outer semi-conducting sheath 14 of the cable have been shown here, and in this figure and FIGS. 3 and 4 only a half of one end of the cable joint is shown in cross-section. It is shown how the insulating layer 6 ends by a substantially sharp edge forming a transversal surface 15 continuing into the resistive layer while making this thinner in the direction towards said other end 5. This result in an angle made by the interface between the resistive layer 2 and the insulating layer 6 to said semi-conducting or conducting layer 8 in said triple point of close to 90° resulting in the advantages described above. This geometry may be easily obtained by grinding the resistive layer and the insulating layer after having been wound as described above.

FIG. 3 is a view similar to FIG. 2 of an embodiment differing from the embodiment according to FIG. 2 by the fact that here a recess 20 has been created in said resistive layer close to the triple point 9 and this recess receives an end portion 21 of the insulating layer 6 for obtaining a said angle close to 90°.

FIG. 4 shows how said angle in said triple point is instead obtained by providing the resistive layer with a tip-like elevation 17 with a tip defining said triple point with the insulating layer and the semi-conducting or conducting layer arranged on each side of said tip.

Figure 6:
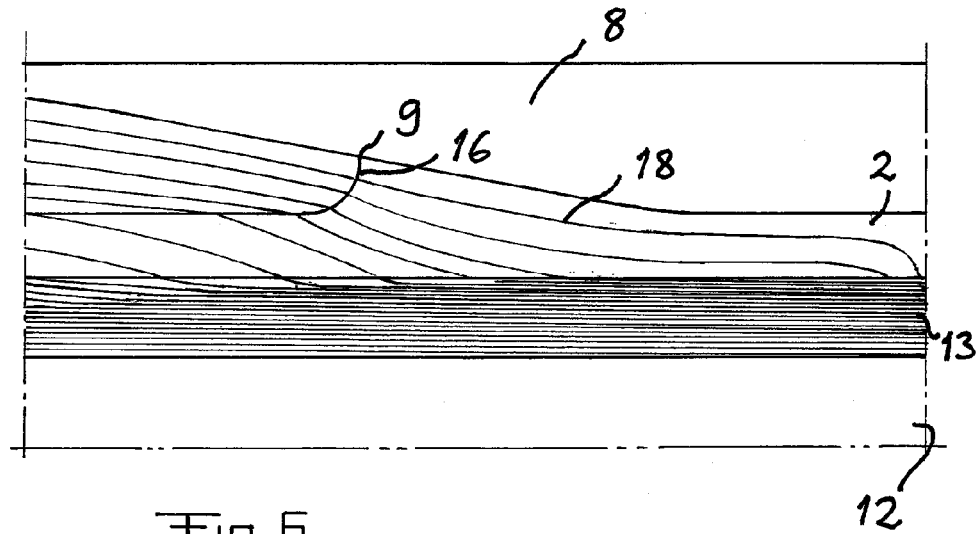

FIGS. 5 and 6 illustrates how the equipotential lines 18 will extend very smoothly in the region of said triple point 9 thanks to the appearance of this triple point with the angle between said interface 16 and said semi-conducting or conducting layer 8 close to 90°, such as 70-110°. This means that for a given material and thickness of the resistive layer the voltages of said live part of the cable may be increased considerably with respect to cable joints according to the prior art without causing damage of the cable joint in the region of the triple point 9.

Figure 7:
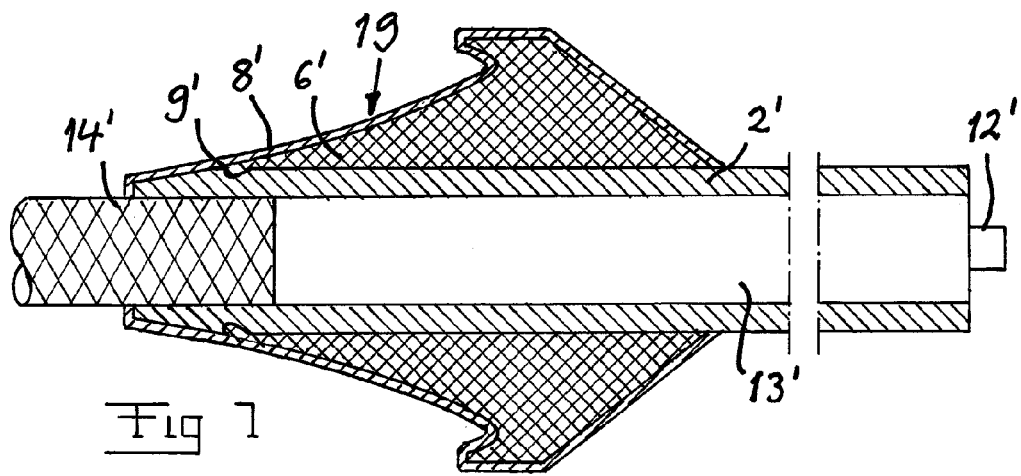
FIG. 7 is a simplified view illustrating a cable termination provided with an electric field control device according to an embodiment of the invention.

FIG. 7 illustrates a cable termination 19 having an electric field control device according to the present invention, and parts of this device corresponding to such of the device according to FIG. 1 have been provided with the same reference numerals with addition of a prime. Said triple point is also crucial for the strength of such a cable termination, and the design of the different layers in connection with this triple point results in the same advantages as described above for a cable joint.

The invention is of course not in any way restricted to the embodiments described above, but many possibilities to modifications thereof would be apparent to a person with ordinary skill in the art without departing from the basic idea of the invention as defined in the appended claims.

The invention claimed is:

1. A device for controlling an electric field at a high voltage component, said device comprising:

a resistive layer arranged along said component and which at a first end is configured to be electrically connected to a live high voltage part of the component and, at a second end, configured to be electrically connected to ground potential, an insulating layer arranged on said resistive layer and extending outside thereof from said first end towards said second end, the insulating layer terminated by a tapering field controlling geometry without reaching the second end and at a distance to said second end, and a semi-conducting or conducting layer arranged on the insulating layer and extending outside thereof past an end of the insulating layer towards said second end of the resistive layer, so that said resistive layer, said insulating layer and said semi-conducting or conducting layer meet at a triple point at said end of the insulating layer, wherein said insulating layer ends in an extension thereof from said first end towards said second end by a substantially sharp edge forming a transversal surface continuing into the re-sistive layer for forming a step in said resistive layer and making the resistive layer thinner in a direction towards said second end.

2. The device according to claim 1, wherein said resistive layer, said insulating layer and said semi-conducting or conducting layer form a sleeve for receiving said high voltage component with the resistive layer being an innermost layer of the sleeve.

3. The device according to claim 1, wherein the device is adapted to control electric fields at high voltage components having an alternating voltage or a direct voltage on said live high voltage part, and wherein the device is adapted to control electric fields for high voltages being above 1 kV, above 50 kV, above 100 kV, 130 kV-400 kV, 200 kV-400 kV or 250 kV-350 kV.

4. A cable joint for joining two high voltage DC-cables or AC-cables, the cable joint comprising:

a device for electric field control at each end thereof, each device for electric field control comprising a resistive layer arranged along a component and which at a first end is configured to be electrically connected to a live high voltage part of the component and, at a second end, configured to be electrically connected to ground potential, an insulating layer arranged on said resistive layer and extending outside thereof from said first end towards said second end, the insulating layer terminated by a tapering field controlling geometry without reaching the second end and at a distance to said second end, and a semi-conducting or conducting layer arranged on the insulating layer and extending outside thereof past an end of the insulating layer towards said second end of the resistive layer, so that said resistive layer, said insulating layer and said semi-conducting or conducting layer meet at a triple point at said end of the insulating layer, wherein said insulating layer ends in an extension thereof from said first end towards said second end by a substantially sharp edge forming a transversal surface continuing into the resistive layer for forming a step in said resistive layer and making the resistive layer thinner in a direction towards said second end.

5. A cable termination for terminating a high voltage DC-cable or AC-cable, the cable termination comprising:

a device for electric field control comprising a resistive layer arranged along a component and which at a first end is configured to be electrically connected to a live high voltage part of the component and, at a second end, configured to be electrically connected to ground potential, an insulating layer arranged on said resistive layer and extending outside thereof from said first end towards said second end, the insulating layer terminated by a tapering field controlling geometry without reaching the second end and at a distance to said second end, and a semi-conducting or conducting layer arranged on the insulating layer and extending outside thereof past an end of the insulating layer towards said second end of the resistive layer, so that said resistive layer, said insulating layer and said semi-conducting or conducting layer meet at a triple point at said end of the insulating layer, wherein said insulating layer ends in an extension thereof from said first end towards said second end by a substantially sharp edge forming a transversal surface continuing into the resistive layer for forming a step in said resistive layer and making the resistive layer thinner in a direction towards said second end.

6. A method for producing a device for controlling an electric field, the method comprising:

winding a resistive layer around a carrier in a number of sub-layers and then grinding the resistive layer, winding an insulating layer outside the resistive layer in a number of sub-layers and then grinding the insulating layer, and winding a semi-conducting or conducting layer in sub-layers outside the insulating layer and the resistive layer, wherein at least one of the resistive layer or the insulating layer are ground for obtaining an angle in a triple point.

7. A device for controlling an electric field at a high voltage component, said device comprising:

a resistive layer arranged along said component and which at a first end is configured to be electrically connected to a live high voltage part of the component and, at a second end, configured to be electrically connected to ground potential, an insulating layer arranged on said resistive layer and extending outside thereof from said first end towards said second end, the insulating layer terminated by a tapering field controlling geometry without reaching the second end and at a distance to said second end, and a semi-conducting or conducting layer arranged on the insulating layer and extending outside thereof past an end of the insulating layer towards said second end of the resistive layer, so that said resistive layer, said insulating layer and said semi-conducting or conducting layer meet at a triple point at said end of the insulating layer, wherein said resistive layer comprises a recess in a region of said triple point receiving an end portion of said insulating layer.

8. A device for controlling an electric field at a high voltage component, said device comprising:

a resistive layer arranged along said component and which at a first end is configured to be electrically connected to a live high voltage part of the component and, at a second end, configured to be electrically connected to ground potential, an insulating layer arranged on said resistive layer and extending outside thereof from said first end towards said second end, the insulating layer terminated by a tapering field controlling geometry without reaching the second end and at a distance to said second end, and a semi-conducting or conducting layer arranged on the insulating layer and extending outside thereof past an end of the insulating layer towards said second end of the resistive layer, so that said resistive layer, said insulating layer and said semi-conducting or conducting layer meet at a triple point at said end of the insulating layer, wherein said resistive layer comprises a tip-like elevation in a region of said triple point with the tip-like elevation ending in said triple point and having said insulating layer on one side thereof and said semi-conducting or conducting layer on the other side thereof.

* * * * *